United States Patent [19]
Hayakawa et al.

[11] Patent Number: 6,011,413
[45] Date of Patent: Jan. 4, 2000

[54] STRUCTURE OF CURRENT MEASURING CIRCUIT

[75] Inventors: Junji Hayakawa; Junichi Nagata, both of Okazaki, Japan

[73] Assignee: Denso Corporation, Kariya, Japan

[21] Appl. No.: 09/092,247

[22] Filed: Jun. 5, 1998

[30] Foreign Application Priority Data

Jun. 5, 1997 [JP] Japan ..................................... 9-148058
Aug. 20, 1997 [JP] Japan ..................................... 9-223818

[51] Int. Cl.$^7$ .................................................. G01R 19/00
[52] U.S. Cl. ............................................. 327/51; 327/538
[58] Field of Search ................................ 327/51, 52, 538, 327/540, 541, 543; 323/277, 315

[56] References Cited

U.S. PATENT DOCUMENTS

| 5,081,379 | 1/1992 | Korteling | 307/530 |
| 5,300,837 | 4/1994 | Fischer | 307/491 |
| 5,473,276 | 12/1995 | Throngnumchai | 327/432 |
| 5,519,310 | 5/1996 | Bartlett | 323/316 |

FOREIGN PATENT DOCUMENTS

| 5327442 | 12/1993 | Japan . |
| 752370 | 6/1995 | Japan . |
| 8334534 | 12/1996 | Japan . |

Primary Examiner—Toan Tran
Assistant Examiner—Anh-Quan Tra
Attorney, Agent, or Firm—Pillsbury Madison & Sutro

[57] ABSTRACT

A current-measuring circuit is provided which is designed to measure the current flowing through an electric load and a switching transistor. The current-measuring circuit includes a current-measuring device. The current-measuring device includes a current-measuring transistor and a voltage control circuit. The current-measuring transistor is disposed in parallel to the switching transistor and allows the current to flow therethrough that is proportional to the current flowing through the electric load and the switching transistor and that is used to measure the current flowing through the switching transistor and the electric load. The voltage control circuit controls a potential difference across the current-measuring transistor so as to match a potential difference across the switching transistor, thereby achieving the proportion of the current flowing through the current-measuring transistor to the current flowing through the switching transistor and the electric load.

18 Claims, 11 Drawing Sheets

STRUCTURE OF CURRENT MEASURING CIRCUIT

BACKGROUND OF THE INVENTION

1 Technical Field of the Invention

The present invention relates generally to a current-measuring circuit designed to measure the current flowing through an electric path, and more particularly to a current-measuring circuit which has a simple structure, yet is capable of current measurement with high accuracy.

2 Background of Related Art

U.S. Pat. No. 5,081,379 to Korteling teaches a current-sensing circuit designed to measure the current flowing through a power transistor.

FIG. 1 shows a current-sensing circuit like the one taught in Korteling which includes an current-carrying transistor Q1, a current-measuring transistor Q2, and n-channel MOS transistors Q4 and Q5. The current-carrying transistor Q1 is an n-channel MOS transistor which is connected at a drain to a voltage source VD and at a source to ground through an electric load L. The current-measuring transistor Q2 is an n-channel MOS transistor which is connected at a drain to the drain of the current-carrying transistor Q1 and at a gate to a gate of the current-carrying transistor Q1. The MOS transistor Q4 has a drain and a source disposed in a current path extending from the source of the current-measuring transistor Q2 to ground and has a gate connected to the drain thereof. The MOS transistor Q5 constitutes a current mirror together with the MOS transistor Q4.

The current-sensing circuit also includes an operational amplifier OP and a p-channel MOS transistor Q3. The operational amplifier OP is connected at a non-inverting input (+) to the source of the current-carrying transistor Q1 and an inverting input (−) to the source of the current-measuring transistor Q2 and serves to match the source voltage of the current-measuring transistor Q2 to the source voltage of the current-carrying transistor Q1. The MOS transistor Q3 is disposed in series between the source of the current-measuring transistor Q2 and the drain of the MOS transistor Q4 and connected at a gate to an output terminal of the operational amplifier OP.

When a common voltage is applied to the gates of the current-carrying transistor Q1 and the current-measuring transistor Q2, the current flows the transistors Q1 and Q2, thereby causing the drain-source voltage of the MOS transistor Q3 driven by an output of the operational amplifier OP to change, so that the source voltage of the current-measuring transistor Q2 agrees with the source voltage of the current-carrying transistor Q1. This causes electric potentials appearing among all the terminals of the current-carrying transistor Q1 and the current-measuring transistors Q2 to be identical with each other. The current $I_{Q1}$, thus, flows through the current-carrying transistor Q1 (i.e., the load current flowing through the electric load L), while the current $I_{Q2}$ which is determined by a size ratio of the current-measuring transistor Q2 to the current-carrying transistor Q1 flows through the current-measuring transistor Q2 and enters the MOS transistor Q4 through the MOS transistor Q3. This causes the current i that is a multiple of the current $I_{Q2}$ to flow through the MOS transistor Q5, which is used in measuring the current $I_{Q1}$ flowing through the current-carrying transistor Q1.

As apparent from the above discussion, the conventional current-sensing circuit is capable of measuring the current $I_{Q1}$ flowing through the current-carrying transistor Q1 accurately by matching the source voltage of the current-measuring transistor Q2 to the source voltage of the current-carrying transistor Q1 with aid of activities of the operational amplifier OP and the voltage-controlling MOS transistor Q3, however, it has the following drawbacks.

The agreement of the source voltage of the current-measuring transistor Q2 with that of the current-carrying transistor Q1 is achieved by controlling the gate-source voltage of the voltage-controlling MOS transistor Q3. The source of the MOS transistor Q3 is connected to the source of the current-measuring transistor Q2, and the source voltage of the current-measuring transistor Q2 is basically equal to the source voltage that is an output voltage Va of the current-carrying transistor Q1, therefore, the operational amplifier OP needs to change the voltage Vb outputted to the gate of the MOS transistor Q3 depending upon the output voltage Va of the current-carrying transistor Q1.

Specifically, the operational amplifier OP is required to provide a voltage output over a range within which the output voltage Va of the current-carrying transistor Q1 will change. For instance, when the output voltage Va of the current-carrying transistor Q1 changes from 1 volt or less to several tens of volts, the operational amplifier OP needs to change the voltage Vb outputted to the gate of the MOS transistor Q3 greatly according to the change in output voltage Va.

Accordingly, the conventional current-sensing circuit needs to consider the output voltage Va of the current-carrying transistor Q1 in determining the voltage and capacity of a power source of the operational amplifier OP, thus resulting in complexity of circuit design.

SUMMARY OF THE INVENTION

It is therefore a principal object of the present invention to avoid the disadvantages of the prior art.

It is another object of the present invention to provide an easy-to-design current-measuring circuit capable of current measurement with high accuracy.

According to one aspect of the present invention, there is provided a current-measuring circuit for measuring a current flowing through an electric load which comprises: (a) a first electric path in which the electric load is disposed, the first electric path having a first and a second terminal, the first terminal being at a first electric potential, the second terminal being at a second electric potential different from the first electric potential; (b) a current-carrying transistor having first, second, and third electrodes, the first electrode connecting with the first terminal of the first electric path, the second electrode connecting with the second terminal of the first electric path through the electric load, the third electrode being applied with an excitation signal to allow a current to flow between the first and second terminals of the first electric path through the electric load; (c) a second electric path having a first and a second terminal, the first terminal connecting with the first terminal of the first electric path, the second terminal being at a third electric potential; (d) a third electric path having a first and a second terminal, the first terminal being at a fourth electric potential, the second terminal connecting with the second electric path; (e) a current-measuring transistor disposed in the second electric path between a junction of the second and third electric paths and the first terminal of the first electric path, the current-measuring transistor being identical in a type and polarity with the current-carrying transistor and having first, second, and third electrodes, the first electrode connecting with the first electrode of the current-carrying transistor, the third electrode connecting with the third electrode of the current-carrying transistor; (f) a current mirror including a first and a second transistor, the first transistor being disposed in the second electric path between the junction of the second and third electric paths and the second electrode of the current-measuring transistor, the second transistor being disposed in the third electric path between the junction of the second and third electric paths and the first terminal of the third electric path to allow a current to flow therethrough that is a given multiple of a current flowing through the first transistor; and (g) a voltage control circuit designed to match a voltage appearing at the second electrode of the current-measuring transistor with a voltage appearing at the second electrode of the current-carrying transistor so that the current flowing through the current-measuring transistor may be proportional to the current flowing through the current-carrying transistor, the voltage control circuit including a voltage-changing load, an operational amplifier, and a voltage-controlling transistor, the voltage-changing load being disposed in the second electric path in series with the second terminal of the second electric path and the first transistor of the current mirror to change a voltage developed at a junction of the voltage-changing load and the first transistor according to a current flowing through the voltage-changing load, the operational amplifier being connected at an inverting input to the second electrode of the current-carrying transistor and at a non-inverting input to the second electrode of the current-measuring transistor, the voltage-controlling transistor being connected at a first electrode to the first electrode of the current-measuring transistor, at a second electrode to the junction of the voltage-changing load and the first transistor, and at a third electrode to an output terminal of the operational amplifier to modify the current flowing through the voltage-changing load in response to an excitation signal inputted from the operational amplifier to the third electrode so as to control the voltage developed at the junction of the voltage-changing load and the first transistor so that the voltage appearing at the second electrode of the current-measuring transistor may match the voltage appearing at the second electrode of the current-carrying transistor.

In the preferred mode of the invention, the second electric potential is higher than the first electric potential. The voltage-controlling transistor of the voltage control circuit is an n-channel MOS transistor.

The second electric potential may alternatively be lower than the first electric potential. In this case, the voltage-controlling transistor of the voltage control circuit is a p-channel MOS transistor.

The voltage-controlling transistor is a bipolar transistor having a collector, an emitter, and a base as the first, second, and third electrodes of the voltage-controlling transistor.

When the second electric potential is higher than the first electric potential, the bipolar transistor is implemented with an npn bipolar transistor.

When the second electric potential is lower than the first electric potential, the bipolar transistor is implemented with an npn bipolar transistor.

The voltage-changing load of the voltage control circuit is a resistor having a preselected resistance value.

The voltage-changing load includes a transistor and a current-restricting device. The transistor is connected at a first electrode to the second terminal of the second electric path, at a second electrode to the first transistor of the current mirror, and a third electrode to the current-restricting device. The current-restricting device restricts a current flowing through the transistor below a preselected value.

According to another aspect of the invention, there is provided a current-measuring circuit for measuring a current flowing through an electric load which comprises: (a) a first electric path in which the electric load is disposed, the first electric path having a first and a second terminal, the first terminal being at a first electric potential, the second terminal being at a second electric potential different from the first electric potential; (b) a current-carrying transistor having first, second, and third electrodes, the first electrode connecting with the first terminal of the first electric path, the second electrode connecting with the second terminal of the first electric path through the electric load, the third electrode being applied with an excitation signal to allow a current to flow through the electric load between the first and second terminals of the first electric path; (c) a second electric path having a first and a second terminal, the first terminal connecting with the first terminal of the first electric path, the second terminal being at a third electric potential; (d) a current-measuring transistor disposed in the second electric path, the current-measuring transistor being identical in a type and polarity with the current-carrying transistor and having first, second, and third electrodes, the first electrode connecting with the first electrode of the current-carrying transistor, the third electrode connecting with the third electrode of the current-carrying transistor; and (e) a voltage control circuit designed to match a potential difference between the first and second electrodes of the current-measuring transistor with a potential difference between the first and second electrodes of the current-carrying transistor so that a current flowing through the current-measuring transistor may be proportional to the current flowing through the current-carrying transistor, the voltage control circuit including an operational amplifier and a voltage-controlling transistor, the operational amplifier being connected at an inverting input to the second electrode of the current-carrying transistor and at a non-inverting input to the second electrode of the current-measuring transistor, the voltage-controlling transistor being connected at a first electrode to the first electrode of the current-measuring transistor, at a second electrode to the second electrode of the current-measuring transistor, and at a third electrode to an output terminal of the operational amplifier to control the voltage developed at the second electrode of the current-measuring transistor so that the potential difference between the first and second electrodes of the current-measuring transistor matches the potential difference between the first and second electrodes of the current-carrying transistor.

In the preferred mode of the invention, the voltage control circuit also includes a voltage-changing load disposed in the second electric path in series with the second terminal of the second electric path and the current-measuring transistor to change a voltage developed at the second electrode of the current-measuring transistor according to a current flowing through the voltage-changing load. The voltage-controlling transistor is responsive to the excitation signal from the operational amplifier to modify the current flowing through the voltage-changing load so as to control the voltage developed at the second electrode of the current-measuring transistor so that the potential difference between the first and second electrodes of the current-measuring transistor matches the potential difference between the first and second electrodes of the current-carrying transistor.

According to a further aspect of the invention, there is provided a current-measuring circuit for measuring a current flowing through an electric load which comprises: (a) an electric path in which the electric load is disposed, the electric path having a first and a second terminal, the first terminal being at a first electric potential, the second terminal being at a second electric potential different from the first electric potential; (b) a current-carrying transistor having first, second, and third electrodes, the first electrode connecting with the first terminal of the first electric path, the second electrode connecting with the second terminal of the first electric path through the electric load, the third electrode being applied with an excitation signal to allow a first current to flow between the first and second terminals of the electric path through the electric load; (c) a current-measuring transistor having a first and a second electrode through which a second current flows that is proportional to the first current flowing through the electric load and that is used to measure the first current, the first electrode being at a third potential; and (d) a voltage control circuit connecting with the first and second electrodes of the current-measuring transistor and the first and second electrodes of the current-carrying transistor, the voltage control circuit controlling an electric potential appearing at the second electrode of the current-measuring transistor so that a potential difference between the first and second electrodes of the current-measuring transistor may be a given multiple of that between the first and second electrodes of the current-carrying transistor.

In the preferred mode of the invention, the voltage control circuit includes a first and a second voltage divider and an operational amplifier. The first voltage divider provides a first voltage output that is a fraction of a potential difference between a higher one of electric potentials developed at the first and second electrodes of the current-carrying transistor and a lower one of electric potentials developed at the first and second electrodes of the current-measuring transistor. The second voltage divider provides a second voltage output that is a fraction of a potential difference between a lower one of electric potentials developed at the first and second electrodes of the current-carrying transistor and a higher one of electric potentials developed at the first and second electrodes of the current-measuring transistor. The operational amplifier changes the electric potential appearing at the second electrode of the current-measuring transistor so as to match the first voltage output with the second voltage output.

The current-carrying transistor and the current-measuring transistor are each implemented with a MOS transistor.

A first and a second driver are further provided. The first driver applies an excitation voltage across a gate and a source of the current-carrying transistor to allow the first current to flow through the current-carrying transistor. The second driver applies an excitation voltage across a gate and a source of the current-measuring transistor to allow the second current to flow through the current-measuring transistor.

The current-carrying transistor and the current-measuring transistor may be implemented with a bipolar transistor. In this case, the first driver applies the excitation voltage across a base and an emitter of the current-carrying transistor to allow the first current to flow through the current-carrying transistor. The second driver applies the excitation voltage across a base and an emitter of the current-measuring transistor to allow the second current to flow through the current-measuring transistor.

A current mirror is further provided which includes a first and a second transistor. The first transistor is disposed between the voltage control circuit and the current-measuring transistor so that the second current flows through the first transistor. The second transistor is disposed between the voltage control circuit and an output terminal so that a third current flows through the second transistor that is a given multiple of the second current.

A voltage-changing load and a voltage-controlling transistor are further provided. The voltage-changing load has a first end connected to a voltage source and a second end connected to the second electrode of the current-measuring transistor to change a voltage developed at the second end thereof according to a current flowing through the voltage-changing load from the voltage source. The voltage-controlling transistor is disposed in parallel to the current-measuring transistor and connected at a first electrode to the first electrode of the current-measuring transistor, at a second electrode to a junction of the second end of the voltage-controlling load and the second electrode of the current-measuring transistor, and at third electrode to the output terminal of the operational amplifier to modify the current flowing through the voltage-changing load in response to the excitation signal inputted from the operational amplifier so as to control the voltage developed at the second end of the voltage-changing load so that the voltage appearing at the second electrode of the current-measuring transistor may match the voltage appearing at the second electrode of the current-carrying transistor.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 2:
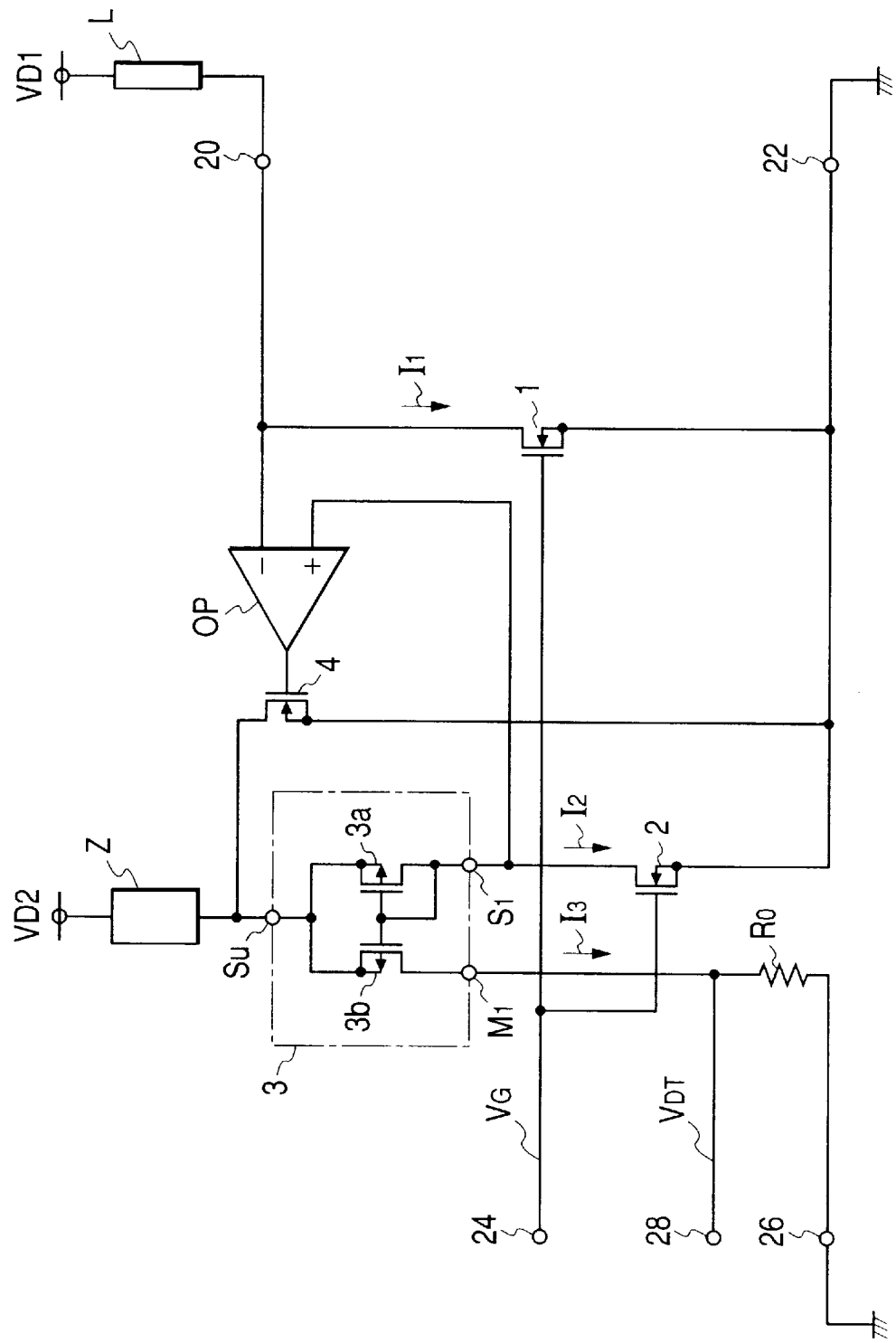
FIG. 2 is a circuit diagram which shows a current-measuring circuit according to the first embodiment of the invention.

Referring now to the drawings, wherein like reference numbers refer to like parts throughout several views, particularly to FIG. 2, there is shown a current-measuring circuit according to the first embodiment of the invention.

The current-measuring circuit includes generally an current-carrying transistor 1, a current-measuring transistor 2, a first transistor 3a, a second transistor 3b, and a resistor Z. The current-carrying transistor 1 is connected at a source to ground (=0V) through a terminal 22 and at a drain to a voltage source VD 1 through a terminal 20 and an electric load L and, when turned on, allows the current $I_1$ to flow through the electric load L. The voltage source VD1 provides the voltage level higher than the ground potential. The current-measuring transistor 2 is identical in a type and polarity with the current-carrying transistor 1 and has a source and a gate connected to a source and a gate of the current-carrying transistor 1, respectively. The first transistor 3a has a drain and a gate connected to each other and is connected at the drain to a drain of the current-measuring transistor 2. The second transistor 3b has a gate and a source connected to the gate and source of the first transistor 3a and constitutes a current mirror 3 together with the first transistor 3a. The resistor Z is disposed between the sources of the first and second transistors 3a and 3b and a second voltage source VD2 which provides the voltage level higher than the ground potential.

The electric potential appearing at, for example, the source of the current-carrying transistor 1, or a terminal 22 is, as described above, zero (0) volt, however, it may alternatively be any other potential. The voltage source VD2 may be at the same potential as that of the voltage source VD1 or alternatively be at a different potential therefrom.

The current mirror 3 includes a common terminal Su connected to the sources of the first and second transistors 3a and 3b through which a common current flows, a reference current terminal S1 connected to the drain of the first transistor 3a through which a reference current flows, and a mirror current terminal M1 connected to the drain of the second transistor 3b through which a mirror current flows that is a multiple of the reference current flowing through the reference current terminal S1.

The current-measuring circuit also includes an operational amplifier OP, a voltage control transistor 4, and a current-detecting resistor R0. The operational amplifier OP is connected at an inverting input (−) to the drain of the current-carrying transistor 1 and at a non-inverting input (+) to the drain of the current-measuring transistor 2. The voltage control transistor 4 is connected at a drain to a junction (i.e., the common terminal Su) of the resistor Z and the first transistor 3a, at a source to the source of the current-measuring transistor 2 (i.e., the ground), and at a gate to an output terminal of the operational amplifier OP. The current-detecting resistor R0 is disposed in series between the drain of the second transistor 3b (i.e., the mirror current terminal M1) and ground.

In this embodiment, the current-carrying transistor 1, the current-measuring transistor 2, and the voltage control transistor 4 are implemented with an n-channel MOS transistor. The first and second transistor 3a and 3b are each implemented with a p-channel MOS transistor. Specifically, the current-measuring circuit of this embodiment has a low-side coupling structure using the n-channel MOS transistors.

The current-carrying transistor 1 and the current-measuring transistor 2 are supplied at the gates with a gate voltage VG through a terminal 24. The resistor R0 is connected at one end to a current-detecting terminal 28 and at the other end to ground through a terminal 26.

In operation, when the gate voltage VG is not applied to the terminal 24, 0V appears across the gate and the source of the current-carrying transistor 1 to turn off the current-carrying transistor 1 so that no current flows through the electric load L.

When the gate voltage VG is applied to the terminal 24, it will cause the current $I_1$ to flow from the voltage source VD1 to the electric load L through the drain and source of the current-carrying transistor 1 and also the current $I_2$ to flow from the voltage source VD2 to the current-measuring transistor 2 through the resistor Z and the first transistor 3a. The current-carrying transistor 1 and the current-measuring transistor 2 are kept at the drains thereof at the same potential with aid of activities of the resistor Z, the operational amplifier OP, and the voltage control transistor 4 in the following manner.

When the drain voltage of the current-measuring transistor 2 exceeds the drain voltage of the current-carrying transistor 1, it will cause an output voltage of the operational amplifier OP to rise to decrease an on-resistance of the voltage control transistor 4 so that the amount of current flowing from the resistor Z to ground through the voltage control transistor 4 increases. This causes the voltage appearing at the junction of the resistor Z and the first transistor 3a (i.e., the common terminal Su of the current mirror 3) to drop to decrease the drain voltage of the current-measuring transistor 2 with the result that the drains of both the transistors 1 and 2 are kept at the same potential.

Conversely, when the drain voltage of the current-measuring transistor 2 is lowered below the drain voltage of the current-carrying transistor 1, it will cause the output voltage of the operational amplifier OP to drop to increase the on-resistance of the voltage control transistor 4 so that the amount of current flowing from the resistor Z to ground through the voltage control transistor 4 decreases. This causes the voltage appearing at the junction of the resistor Z and the first transistor 3a to rise to increase the drain voltage of the current-measuring transistor 2 with the result that the drains of both the transistors 1 and 2 are kept at the same potential.

Specifically, in the current-measuring circuit of this embodiment, the voltage control transistor 4 serves to increase or decrease the amount of current flowing through the resistor Z in response to the output voltage level of the operational amplifier OP to control the voltage appearing at the junction of the resistor Z and the first transistor 3a for matching the drain voltage of the current-measuring transistor 2 with the drain voltage of the current-carrying transistor 1. This matching causes the drain-source potential differences of the current-carrying transistor 1 and the current-measuring transistor 2 to be brought into agreement with each other so that operating points of the transistors 1 and 2 agree with each other throughout saturation and non-saturation operating regions. The current $I_2$, thus, flows through the first transistor 3a and the current-measuring transistor 2 which is exactly proportional to the current $I_1$ flowing through the current-carrying transistor 1 (i.e., the electric load L) according to a size ratio of the current-measuring transistor 2 to the current-carrying transistor 1.

The flow of the current $I_2$ through the first transistor 3a causes the current $I_3$ that is a given multiple of the current $I_2$ to flow through the second transistor 3b of the current mirror 3. The measurement of the current $I_1$ flowing through the drain and source of the current-carrying transistor 1 is, thus, achieved by monitoring the voltage $V_{DT}$ appearing at the terminal 28 when the current $I_3$ flows through the current-detecting resistor R0.

Note that a ratio of the current $I_2$ to the current $I_3$ is a current mirror ratio determined by the sizes or geometries of the first and second transistors 3a and 3b.

If a size ratio of the current-carrying transistor 1 to the current-measuring transistor 2 is m: 1, then the relation between the current $I_1$ flowing through the current-carrying transistor 1 and the current $I_2$ flowing through the current-measuring transistor 2 may be expressed as:

$$I_1 = m \times I_2 \qquad (1)$$

If the current mirror ratio of the current mirror 3 is 1: n, then the current $I_3$ flowing through the second transistor 3b and the current-detecting resistor R0 may be expressed as:

$$I_3 = n \times I_2 \qquad (2)$$

From the above equations (1) and (2), the voltage $V_{DT}$ developed at the terminal 28 is $$V_{DT} = (n/m) \times RO \times I_1 \qquad (3)$$

where RO is a resistance value of the current-detecting resistor R0.

The equation (3) shows that the voltage $V_{DT}$ is proportional to the current $I_1$ flowing through the current-carrying transistor 1, and the constant of proportion depends upon only the size ratio of the current-carrying transistor 1 to the current-measuring transistor 2 (i.e., m: 1), the current mirror ratio of 1: n, and the resistance value of the current-detecting resistor R0.

In the current mirror 3, temperature characteristics of the first and second transistors 3a and 3b are canceled by each other, and temperature characteristics of the current-carrying transistor 1 and the current-measuring transistor 2 are also canceled by each other. The above equations (1) to (3) are, therefore, satisfied regardless of a change in ambient temperature.

Accordingly, the accurate measurement of the current $I_1$ flowing through the current-carrying transistor 1 is accomplished with the use of the current-detecting resistor R0 having an exact resistance value and a good temperature characteristic.

As apparent from the above discussion, the current-measuring circuit of this embodiment is designed to match the electric potential at the drain of the current-measuring transistor 2 with that at the drain of the current-carrying transistor 1 by adjusting the current flowing through the resistor Z disposed in series between the common terminal Su of the current mirror 3 and the voltage source VD2 using the voltage control transistor 4. The voltage control transistor 4 is connected at the source to the source of the current-measuring transistor 2 (i.e., the ground potential) so that the source voltage of the voltage control transistor 4 is kept at the ground potential at all times. The turning on and off the voltage control transistor 4 is, thus, accomplished easily by applying the voltage to the gate of the voltage control transistor 4 on the basis of the ground potential through the operational amplifier OP.

For instance, even when the output voltage of the current-carrying transistor 1 (i.e., the drain voltage) is changed from 1 volt or less to several tens of volts, the control of the voltage control transistor 4 may be achieved by changing the output voltage of the operational amplifier OP (i.e., the gate voltage of the voltage control transistor 4) within a range of several volts. It is, thus, unnecessary to consider the output voltage of the current-carrying transistor 1 in determining the source voltage and capacity of the operational amplifier OP. This facilitates ease of design of the current-measuring circuit and eliminates the need for an operational amplifier capable of outputting the voltage over a wide range within which the output voltage of the current-carrying transistor 1 would change.

Figure 3:
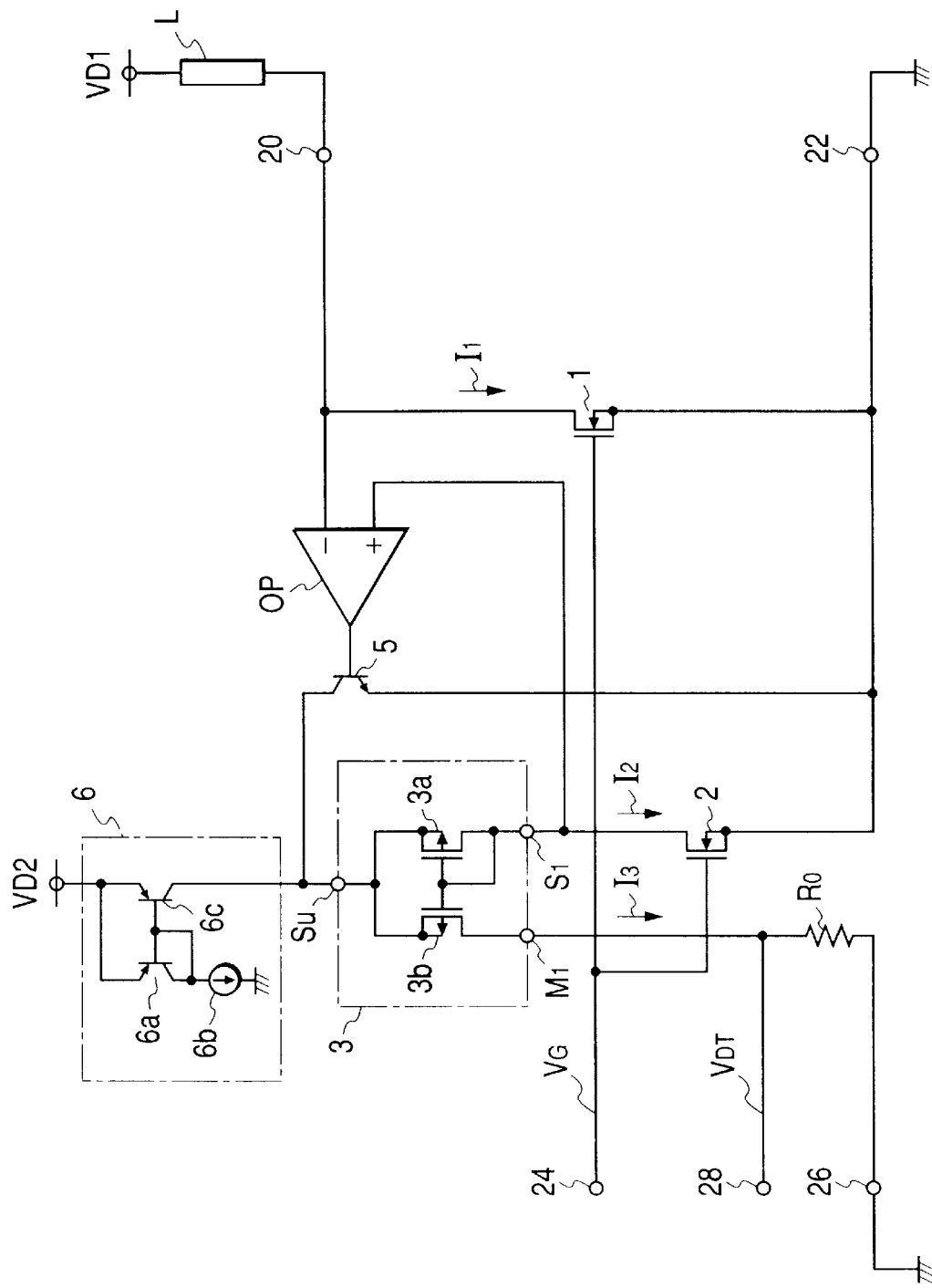
FIG. 3 is a circuit diagram which shows a current-measuring circuit according to the second embodiment of the invention.

FIG. 3 shows a current-measuring circuit according to the second embodiment of the invention.

The current-measuring circuit of this embodiment includes a voltage control transistor 5 built of an npn bipolar transistor and a current-supplying circuit 6. Other arrangements are identical with those of the first embodiment, and explanation thereof in detail will be omitted here.

The voltage control transistor 5 is connected at a collector to the common terminal Su of the current mirror 3, at an emitter to the source of the current-measuring transistor 2 (i.e., ground), and at a base to the output terminal of the operational amplifier OP.

The current-supplying circuit consists of a pnp bipolar transistor 6a, a constant-current device 6b, and a pnp bipolar transistor 6c. The transistor 6a has a collector and a base connected to each other and is connected at an emitter to the voltage source VD2. The constant-current device 6b is disposed between the collector of the transistor 6a and ground and so designed as to allow a constant current Ia to flow from the transistor 6a to ground. The transistor 6c is connected at an emitter to the voltage source VD2, at a collector to the common terminal Su of the current mirror 3, and at a base to the base of the transistor 6a.

In operation, the current is supplied from the voltage source VD2 to the common terminal Su of the current mirror 3 through the transistor 6c of the current-supplying circuit 6. As the current flowing through the transistor 6c (i.e., the collector-to-emitter current) increases, the collector-emitter voltage of the transistor 6c rises. The magnitude of current flowing through the transistor 6c depends upon the product of a size ratio of the transistor 6a to 6c and the constant current Ia for overcurrent protection of the voltage control transistor 5.

Therefore, the current-measuring circuit of this embodiment is, like the first embodiment, capable of matching the electric potential at the drain of the current-measuring transistor 2 with that at the drain of the current-carrying transistor 1 by adjusting the current flowing through the transistor 6c of the current-supplying circuit 6 through the voltage control transistor 5 in response to the output voltage of the operational amplifier OP to control the voltage developed at the common terminal Su. This enables the accurate measurement of the current flowing through the current-carrying transistor 1.

The transistors 6a and 6c of the current-supplying circuit 6 may alternatively use MOS transistors.

The above described beneficial advantages of the invention may also be obtained by the structure in which only the current control transistor 4 of the first embodiment is replaced with an npn bipolar transistor or in which only the resistor Z is replaced with the current-supplying circuit 6.

Figure 4:
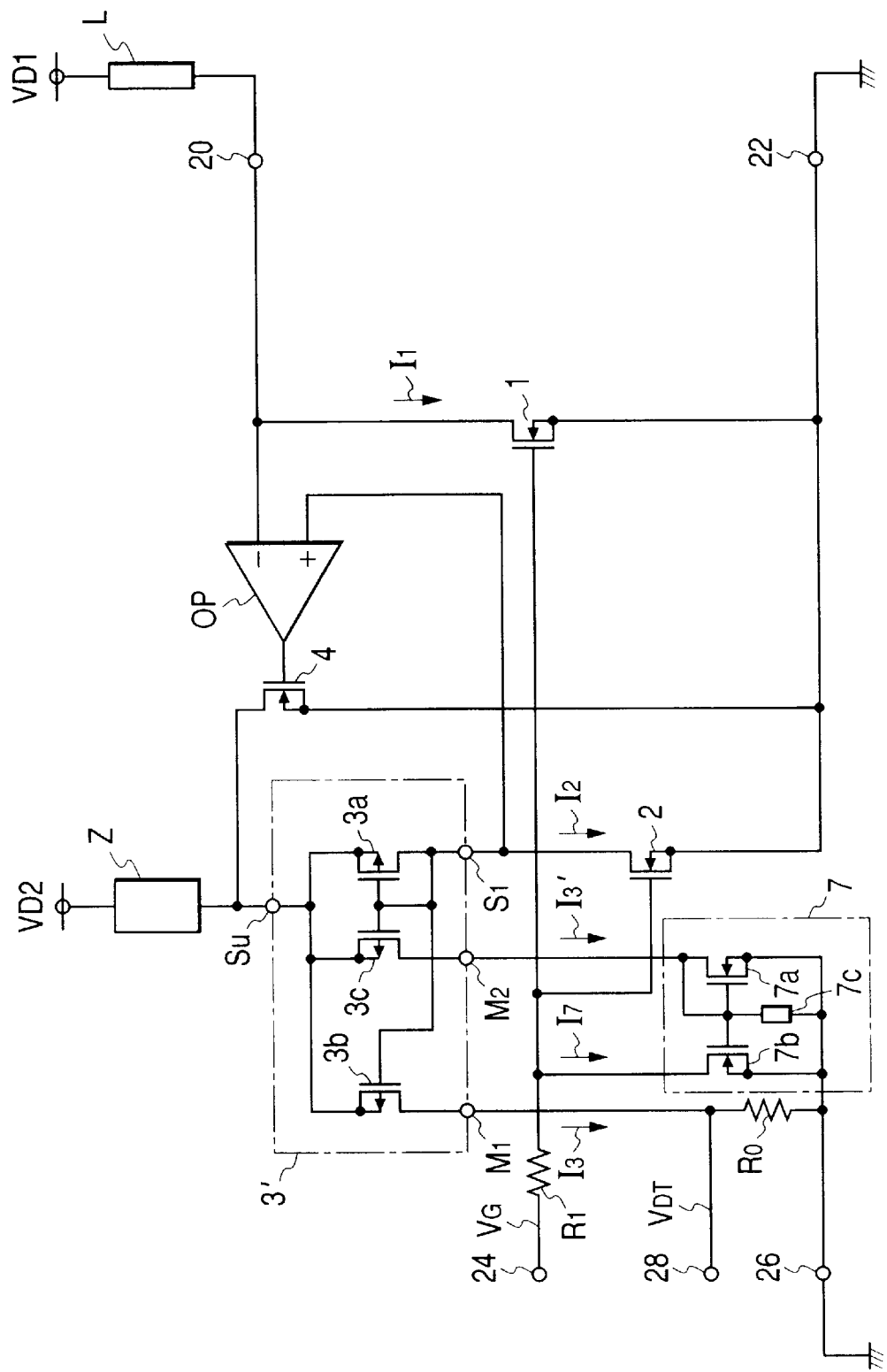
FIG. 4 is a circuit diagram which shows a current-measuring circuit according to the third embodiment of the invention.

FIG. 4 shows a current-measuring circuit according to the third embodiment of the invention.

The current-measuring circuit of this embodiment includes a current mirror 3', a resistor R1, and a second current mirror 7. Other arrangements are identical with those of the first embodiment, and explanation thereof in detail will be omitted here.

The current mirror 3' is different in structure from the current mirror 3 of the first embodiment only in that an n-channel MOS transistor 3c is disposed between the transistors 3a and 3b. The transistor 3c is connected at a gate and a source to the gate and the source of the first transistor 3a and at a drain to a second mirror current terminal M2 through which a mirror current flows that is a preselected multiple of the current flowing through the first transistor 3a.

The ratio of the current $I_2$ flowing through the first transistor 3a to the current $I_3'$ flowing through the third transistor 3c is a current mirror ratio determined by the size ratio of the first transistor 3a to the third transistor 3c.

The resistor R1 is disposed in series between the terminal 24 and the gates of the current-carrying transistor 1 and the current-measuring transistor 2. The gate voltage $V_G$ is applied to the gates of the transistors 1 and 2 through the terminal 24 and the resistor R1.

The second current mirror 7 consists of n-channel MOS transistors 7a and 7b and a threshold current producing device 7c. The transistor 7a has a drain and a gate connected to each other and is connected at the drain to the second mirror current terminal M2 (i.e., the drain of the third transistor 3c of the current mirror 3') and at a source to ground through the terminal 26. The transistor 7b is connected at a gate and a source to the gate and the source of the transistor 7a and at a drain to the gates of the current-carrying transistor 1 and the current-measuring transistor 2. The threshold current producing device 7c connects at both ends with the gates and sources of the transistors 7a and 7b and is built of a resistor or a constant current element which functions as an overcurrent protective device designed to turn on the transistor 7b only when the current $I_3'$ flowing from the second mirror current terminal M2 of the current mirror 3' to the transistor 7a exceeds a preselected threshold value.

In operation, the current $I_3'$ that is proportional to the current $I_1$ flowing through the current-carrying transistor 1 flows from the second mirror current terminal M2 of the current mirror 3' to the MOS transistor 7a of the current mirror 7. When the current $I_3'$ exceeds the threshold value provided by the threshold current producing device 7c, it will cause the transistor 7b of the second current mirror 7 to be turned on, thereby allowing the current $I_7$ to flow from the terminal 24 to ground through the resistor R1. This causes the gate-source voltage of the current-carrying transistor 1 and the current-measuring transistor 2 to drop to limit the current flows through the transistors 1 and 2.

Specifically, when the current $I_1$ flowing through the current-carrying transistor 1 increases undesirably for some reason, the currents $I_1$ and $I_2$ flowing through the transistors 1 and 2 are limited by the activity of the second current mirror 7 to protect the circuit from the overcurrent.

Figure 5:
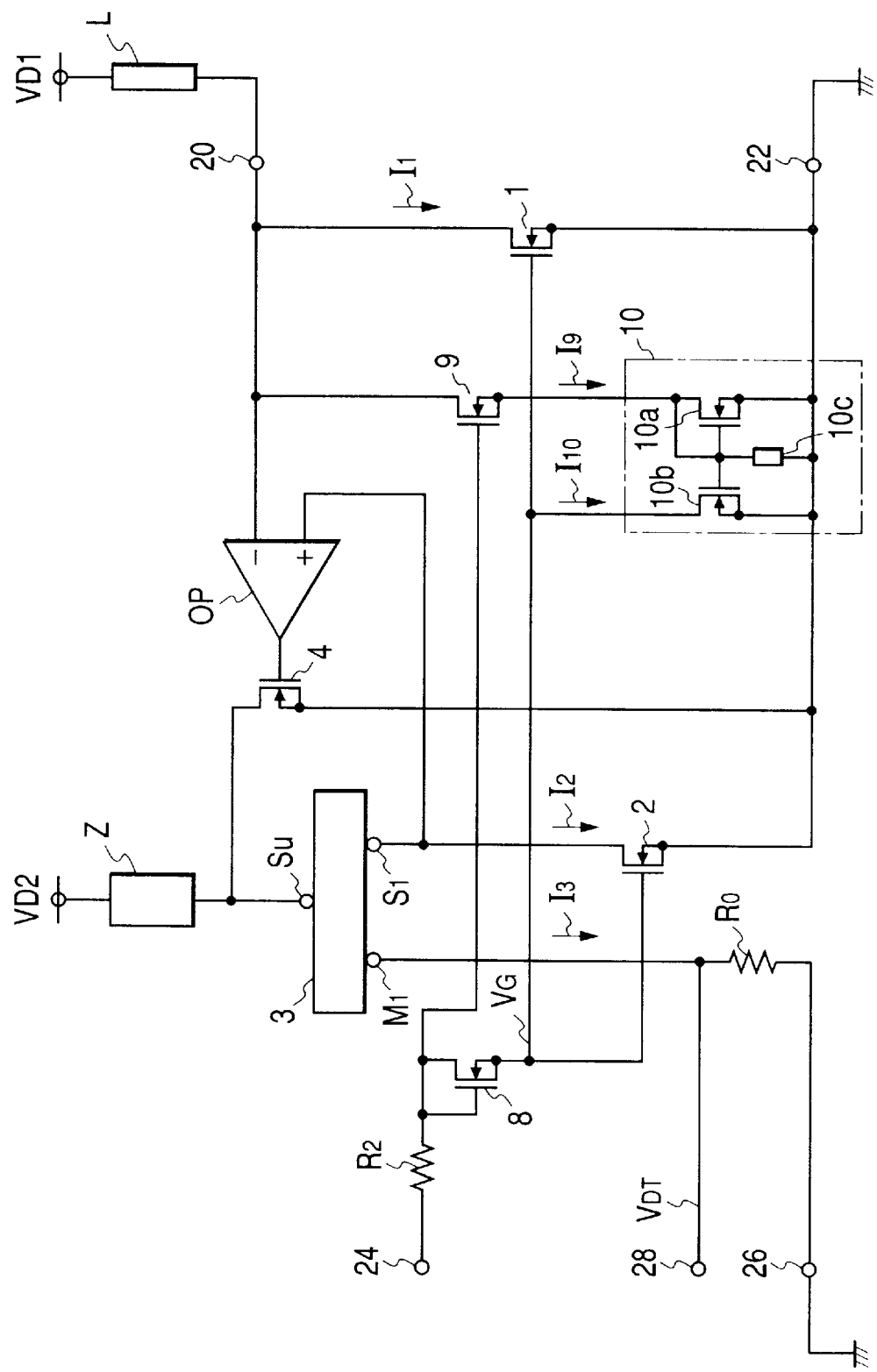
FIG. 5 is a circuit diagram which shows a current-measuring circuit according to the fourth embodiment of the invention.

FIG. 5 shows a current-measuring circuit according to the fourth embodiment of the invention.

The current-measuring circuit of this embodiment includes an n-channel MOS transistor 9, a second current mirror 10, a resistor R2, and an n-channel MOS transistor 8. Other arrangements are identical with those of the first embodiment, and explanation thereof in detail will be omitted here.

The MOS transistor 9 is connected at a drain to the drain of the current-carrying transistor 1, at a source to the current mirror 10, and at a gate to the terminal 24 through the resistor R2.

The current mirror 10 consists of n-channel MOS transistors 10a and 10b and a threshold current producing device 10c. The transistor 10a has a drain and a gate connected to each other and is connected at the drain to the source of the transistor 9 and at a source to ground through the terminal 22. The transistor 10b is connected at a gate and a source to the gate and the source of the transistor 10a and at a drain to the gates of the current-carrying transistor 1 and the current-measuring transistor 2. The threshold current producing device 10c connects at both ends with the gates and sources of the transistors 10a and 10b and is built of a resistor or a constant current element which functions as an overcurrent protective device designed to turn on the transistor 10b only when the current 19 flowing from the transistor 9 to the transistor 10a reaches a preselected threshold value.

The MOS transistor 8 is connected at a drain and a gate to an end of the resistor R2 and a source to the gates of the current-carrying transistor 1 and the current-measuring transistor 2. The resistor R2 is also connected to the gate of the transistor 9. Specifically, the gate voltage is applied to the transistor 9 from the terminal 24 through the resistor R2. The gate voltage $V_G$ is applied to the gates of the current-carrying transistor 1 and the current-measuring transistor 2 from the terminal 24 through the resistor R2 and the drain and source of the transistor 8.

The purpose of the transistor 8 is to match the gate-source voltage of the current-carrying transistor 1 and the current-measuring transistor 2 with the gate-source voltage of the transistor 9.

In operation, when the current $I_g$ that is proportional to the current $I_1$ flowing through the current-carrying transistor 1 flows from the transistor 9 to the transistor 10a of the second current mirror 10, and when the current $I_9$ exceeds the threshold value determined by the threshold current producing device 10c, it will cause the transistor 10b of the second current mirror 10 to be turned on, thereby allowing the current $I_{10}$ to flow from the terminal 24 to ground through the resistor R2 and the transistor 8. This causes the gate-source voltage of the current-carrying transistor 1 and the current-measuring transistor 2 to drop to limit the current flows through the transistors 1 and 2.

Specifically, when the current $I_1$ flowing through the current-carrying transistor 1 increases undesirably for some reason, the currents $I_1$ and $I_2$ flowing through the transistors 1 and 2 are limited by the activity of the second current mirror 10 to protect the circuit from the overcurrent.

Figure 6:
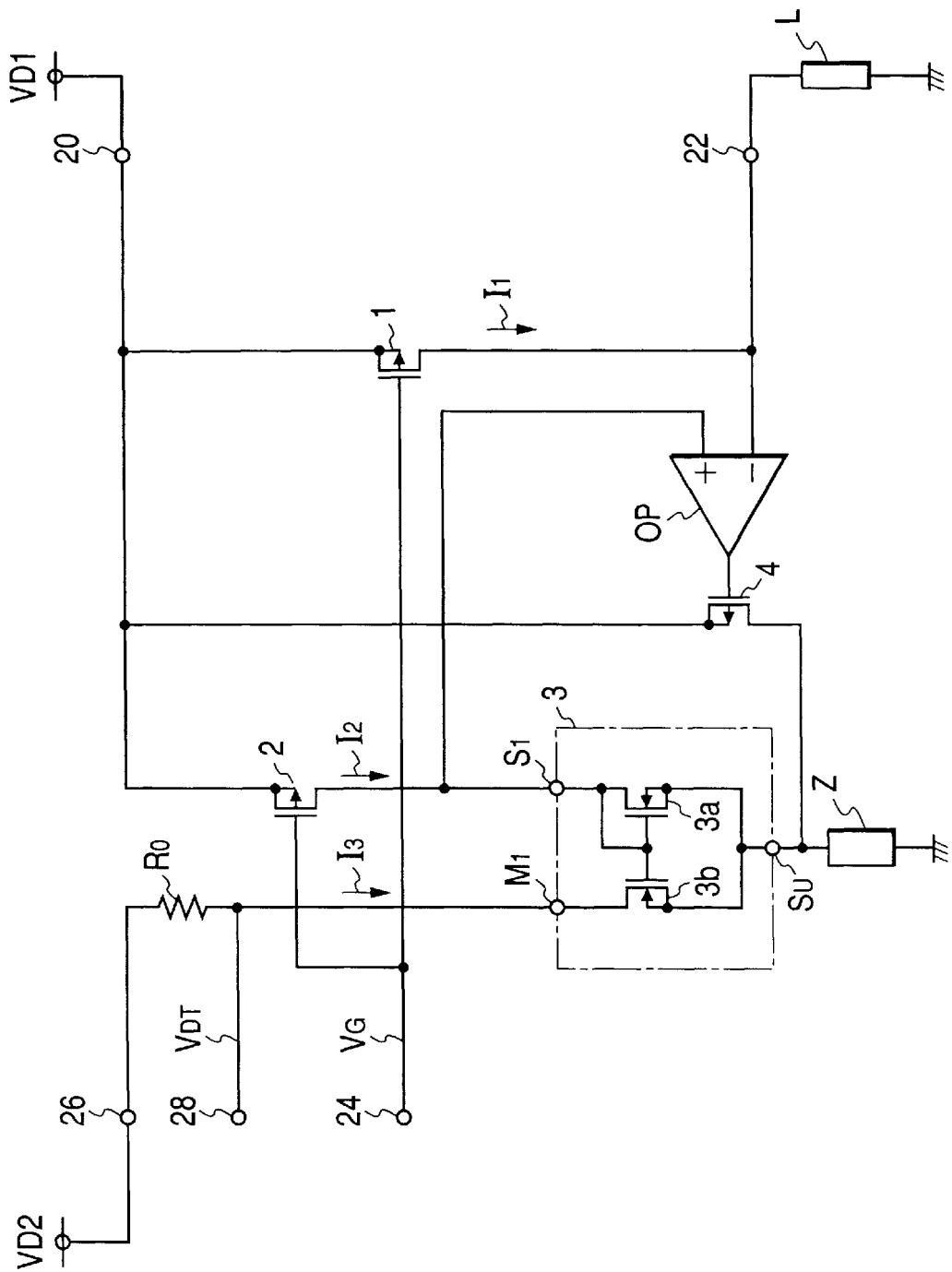
FIG. 6 is a circuit diagram which shows a current-measuring circuit according to the fifth embodiment of the invention.

FIG. 6 shows a current-measuring circuit according to the fifth embodiment of the invention which has a high-side coupling structure different from the first embodiment.

The current-carrying transistor 1, the current-measuring transistor 2, and the voltage control transistor 4 are each implemented with a p-channel MOS transistor. The voltage control transistor 4 may alternatively be implemented with a pnp bipolar transistor.

The first and second transistors 3a and 3b of the current mirror 3 are each implemented with an n-channel MOS transistor.

The current-carrying transistor 1 is connected at the source to the voltage source VD1 through the terminal 20 and at the drain to ground through the terminal 22 and the electric load L.

The resistor Z is connected at one end to ground and at the other end to the sources of the first and second transistors 3a and 3b and the drain of the voltage control transistor 4. The resistor Z may alternatively be kept at a given electric potential lower than that of the voltage source VD2 without being connected to ground. The resistor R0 is connected at one end to the voltage source VD2 through the terminal 26 and at the other end to the drain of the second transistor 3b and the terminal 28. Other arrangements are identical with those of the first embodiment, and explanation thereof in detail will be omitted here.

Functionally, the current-measuring circuit of this embodiment operates in the same manner as that of the first embodiment except that the current flow is reversed.

Specifically, when the drain voltage of the current-measuring transistor 2 exceeds the drain voltage of the current-carrying transistor 1, it will cause an output voltage of the operational amplifier OP to rise to decreases an on-resistance of the voltage control transistor 4 so that the amount of current flowing from the voltage source VD1 to the resistor Z through the voltage control transistor 4 decreases. This causes the voltage appearing at the junction of the resistor Z and the first transistor 3a (i.e., the common terminal Su of the current mirror 3) to drop to decrease the drain voltage of the current-measuring transistor 2 with the result that the drains of both the transistors 1 and 2 are kept at the same potential.

Conversely, when the drain voltage of the current-measuring transistor 2 is lowered below the drain voltage of the current-carrying transistor 1, it will cause the output voltage of the operational amplifier OP to drop to increase the on-resistance of the voltage control transistor 4 so that the amount of current flowing from the voltage source VD1 to the resistor Z through the voltage control transistor 4 increases. This causes the voltage appearing at the junction of the resistor Z and the first transistor 3a to rise to increase the drain voltage of the current-measuring transistor 2 with the result that the drains of both the transistors 1 and 2 are kept at the same potential.

The current-carrying transistor 1 and the current-measuring transistor 2 of the above embodiments may alternatively be implemented with a bipolar transistor or a MIS (Metal-Insulator-Semiconductor) device. In the case where the current-carrying transistor 1 and the current-measuring transistor 2 in the fourth embodiment shown in FIG. 5, are bipolar transistors, the transistor 9 is also implemented with a bipolar transistor.

The current mirrors 3, 3', 7, and 10 may consist of bipolar transistors instead of the MOS transistors or use any other similar circuit known in the art. In the case where the current mirror 10 in the fourth embodiment consists of bipolar transistors, the transistor 8 is also implemented with a bipolar transistor.

Figure 1:
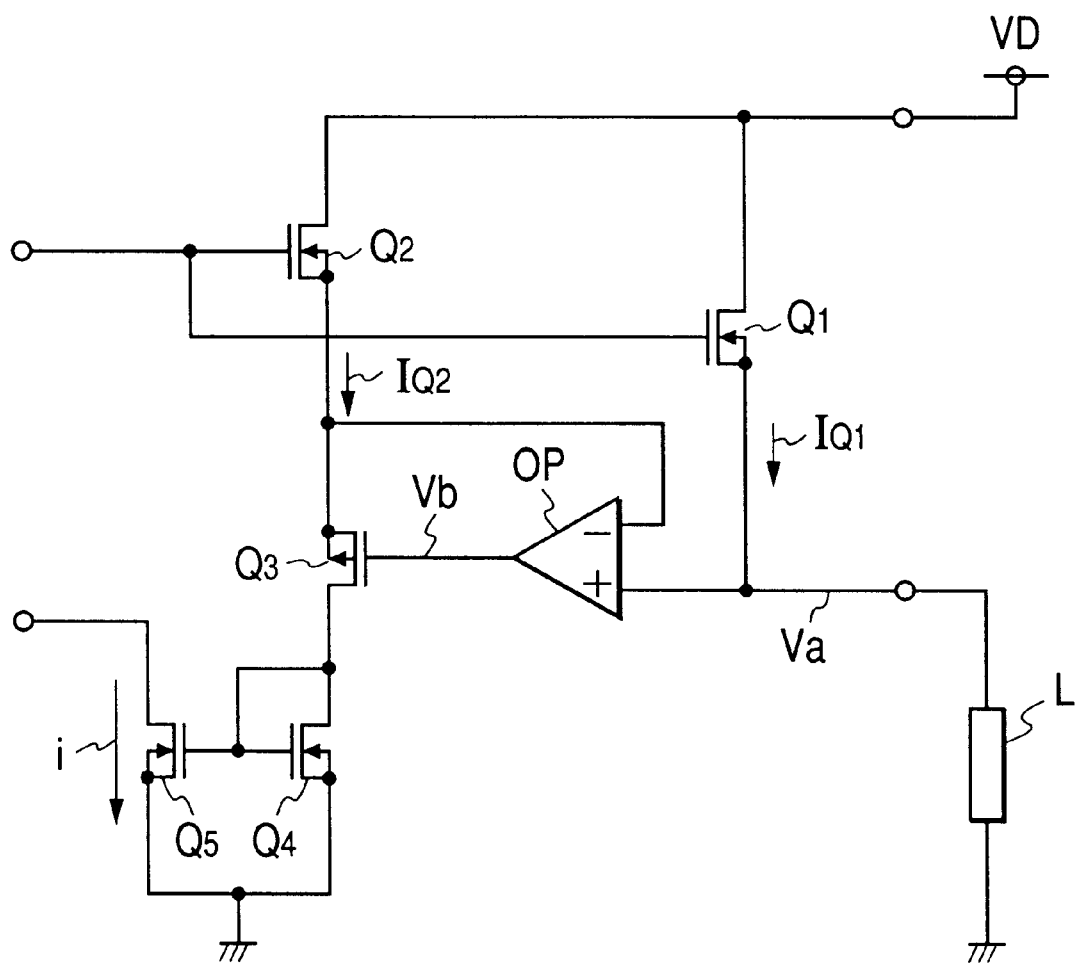
FIG. 1 is a circuit diagram which shows a conventional current-measuring circuit.

Referring back to FIG. 1, if sharp voltage variations that are in phase with each other arise at the drain and the source of the current-carrying transistor Q1 due to electric noise, for example, it will cause the drain-source voltage of the current-measuring transistor Q2 to change regardless of the drain-source voltage of the current-carrying transistor Q1, thereby resulting in an error in measuring the current $I_{Q1}$.

Specifically, the occurrence of a sharp voltage variation or noise at the drain of the current-carrying transistor Q1 induces a similar noise at the drain of the current-measuring transistor Q2 because the drain of the current-measuring transistor Q2 connects directly with the drain of the current-carrying transistor Q1.

Since the operation speed of the current-carrying transistor Q1 is relatively high, a noise that is in phase with the noise occurring at the drain of the current-carrying transistor Q1 also occurs at the source thereof. The drain-source voltage of the current-carrying transistor Q1, thus, hardly changes.

The source voltage of the current-measuring transistor Q2 is, as described above, adjusted by the operational amplifier OP and the voltage control transistor Q3. Thus, when the source voltage of the current-carrying transistor Q1 changes, the operational amplifier OP and the voltage control transistor Q3 are activated so as to match the source voltage of the current-measuring transistor Q2 with the source voltage of the current-carrying transistor Q1.

However, a circuit consisting of the operational amplifier OP and the voltage control transistor Q3 usually operates slower than the current-carrying transistor Q1, therefore, the drain-source voltage of the current-measuring transistor Q2 changes although the drain-source voltage of the current-carrying transistor Q1 does not change. This results in instability of measurement of the current $I_{Q1}$.

Figure 7:
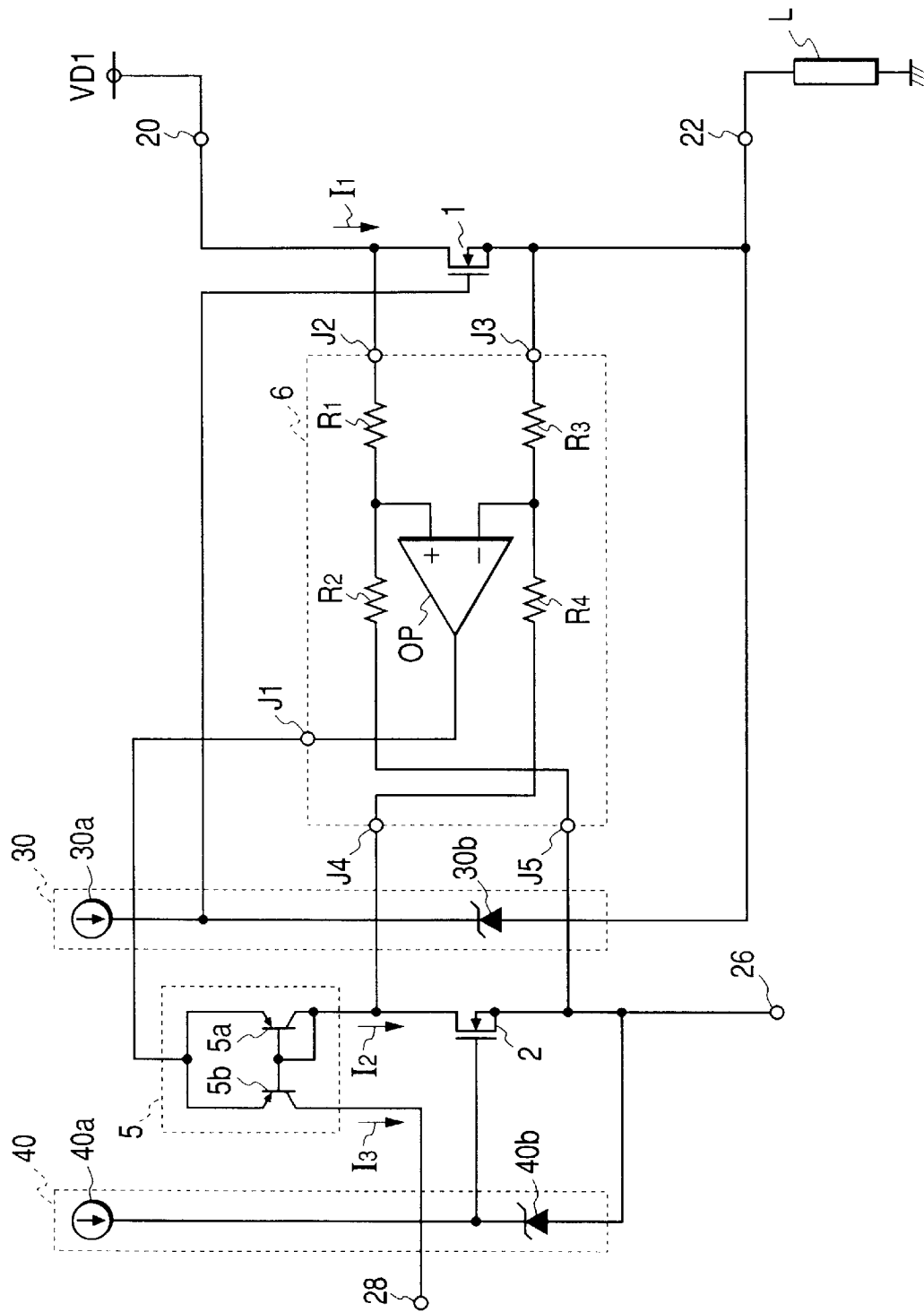
FIG. 7 is a circuit diagram which shows a current-measuring circuit according to the sixth embodiment of the invention.

FIG. 7 shows a current-measuring circuit according to the sixth embodiment of the invention which is designed to alleviate the above problem.

The current-measuring circuit of this embodiment includes first and second drivers 30 and 40, a current mirror 5, and a voltage control circuit 6. Other arrangements are identical with those of the first embodiment, and explanation thereof in detail will be omitted here.

The first driver 30 consists of a constant current source 30a and a zener diode 30b. The constant current source 30a is connected to the gate of the current-carrying transistor 1. The zener diode 30b is connected at a cathode to the constant current source 30a and the gate of the current-carrying transistor 1 and at an anode to the source of the current-carrying transistor 1.

Similarly, the second driver 40 consists of a constant current source 40a and a zener diode 40b. The constant current source 40a is connected to the gate of the current-measuring transistor 2. The zener diode 40b is connected at a cathode to the constant current source 40a and the gate of the current-measuring transistor 2 and at an anode to the source of the current-measuring transistor 2.

The constant current provided by the constant current source 30a of the first driver 30 is identical with that provided by the constant current source 40a of the second driver 40. The zener voltage of the zener diode 30b is also identical with that of the zener diode 40b.

The current mirror 5 consists of first and second pnp transistors 5a and 5b. The first transistor 5a is connected at a collector to a base thereof and the drain of the current-measuring transistor 2. The second transistor 5b is connected at a base and an emitter to the base and emitter of the first transistor 5a and at a collector to the current-detecting terminal 26 from which the current $I_3$ is picked up for measuring the current $I_1$ flowing through the current-carrying transistor 1 and the electric load L.

The voltage control circuit 6 is designed to develop the voltage across the drain and source of the current-measuring transistor 2 that is identical with the drain-source voltage of the current-carrying transistor 1. The voltage control circuit 6 consists of resistors R1 to R4 and an operational amplifier OP. The resistors R1 to R4 have the same resistance value. The resistor R1 is connected at one end to the drain of the current-carrying transistor 1 through an input terminal J2 and at the other end to the resistor R2 and a non-inverting terminal (+) of the operational amplifier OP. The resistor R2 is also connected to the source of the current-measuring transistor 2 through an output terminal J5. The resistor R3 is connected at one end to the source of the current-carrying transistor 1 through an input terminal J3 and at the other end to the resistor R4 and an inverting terminal (−) of the operational amplifier OP. The resistor R4 is also connected to the drain of the current-measuring transistor 2 through an output terminal J4. The operational amplifier OP is also connected at an output terminal to the emitters of the first and second transistors 5a and 5b of the current mirror 5 through an output terminal J1.

In operation, when turned on, the constant current source 30a of the first driver 30 provides a constant current to the zener diode 30b to develop the zener voltage across the cathode and anode thereof which is, in turn, applied across the gate and source of the current-carrying transistor 1 to turn it on.

Similarly, when turned on, the constant current source 40a of the second driver 40 provides a constant current to the zener diode 40b to develop the zener voltage across the cathode and anode thereof which is, in turn, applied across the gate and source of the current-measuring transistor 2 to turn it on. This zener voltage is identical in potential with that of the zener diode 30b applied to the current-carrying transistor 1.

When the current-carrying transistor 1 and the current-measuring transistor 2 are turned on by the application of the zener voltages, the current $I_1$ flows from the voltage source VD1 to the electric load L through the drain and source of the current-carrying transistor 1. The flow of the current $I_1$ through the current-carrying transistor 1 causes the potential difference to be developed between the drain and source thereof because of the on-resistance of the current-carrying transistor 1. The development of potential difference activates the voltage control circuit 6 to adjust the emitter voltages of the first and second transistors 5a and 5b of the current mirror 5 so that the drain-source voltage of the current-measuring transistor 2 may agree with the drain-source voltage of the current-carrying transistor 1.

Specifically, the resistors R1 and R2 provide to the non-inverting input (+) of the operational amplifier OP an output voltage that is a fraction of a difference between the drain voltage of the current-carrying transistor 1 and the source voltage of the current-measuring transistor 2. Similarly, the resistors R3 and R4 provide to the inverting input (−) of the operational amplifier OP an output voltage that is a fraction of a difference between the source voltage of the current-carrying transistor 1 and the drain voltage of the current-measuring transistor 2. The operational amplifier OP modifies an output voltage thereof (i.e., the emitter voltages of the first and second transistors 5a and 5b of the current mirror 5) so that the voltages applied to the non-inverting input (+) and the inverting input (−) may agree with each other.

In the case where the resistance ratio (R2/R1) of the first resistor R1 to the second resistor R2 is equal to the resistance ratio (R4/R3) of the third resistor R3 to the fourth resistor R4, the operational amplifier OP provides the output voltage so that the drain-source voltage of the current-measuring transistor 2 may be (R2/R1=R4/R3) times the drain-source voltage of the current-carrying transistor 1. In this embodiment, the resistors R1 to R4 have, as described above, the same resistance value. The emitter voltages of the first and second transistors 5a and 5b of the current mirror 5 are, thus, controlled by the voltage control circuit 6 so that the drain-source voltage of the current-measuring transistor 2 will be one time the drain-source voltage of the current-carrying transistor 1.

When the drain-source voltage of the current-measuring transistor 2 is brought by the above described activity of the voltage control circuit 6 into agreement with the drain-source voltage of the current-carrying transistor 1, it will cause the drain-source potential differences between the transistors 1 and 2 to match each other so that operating points of the transistors 1 and 2 agree with each other throughout saturation and non-saturation operating regions thereof. The current $I_2$, thus, flows through the current-measuring transistor 2 which is exactly proportional to the current $I_1$ flowing through the current-carrying transistor 1 and the electric load L according to a size ratio (i.e., geometrical area radio) of the current-measuring transistor 2 to the current-carrying transistor 1.

The flow of the current I2 through the first transistor 5a causes the current $I_3$ that is a given multiple of the current $I_2$ to flow through the second transistor 5b of the current mirror 5. The measurement of the current $I_1$ flowing through the drain and source of the current-carrying transistor 1 is, thus, achieved by monitoring the current $I_3$ flowing out of the terminal 28.

If the size ratio of the current-carrying transistor 1 to the current-measuring transistor 2 is m: 1 and the current mirror ratio of the current mirror 5 that is a size ratio of the first to second transistors 5a and 5b is 1: n, then the current $I_3$ may be expressed as:

$$I_2=I_1/m$$

$$I_3=I_2/n$$

thus, $I_3=I_1/(m\times n)$

As apparent from the above discussion, the current-carrying transistor 1 of the current-measuring circuit of this embodiment is not connected directly to the current-measuring transistor 2. The voltage control circuit 6 controls the drain-source voltage of the current-measuring transistor 2 to agree with the drain-source voltage of the current-carrying transistor 1. Therefore, when in-phase voltage variations arise at the drain and source of the current-carrying transistor 1 and causes absolute electric potentials appearing at the drain and source of the current-carrying transistor 1 to change, but the drain-source voltage of the thereof remains unchanged, the drain-source voltage of the current-measuring transistor 2 is kept constant.

Figure 8:
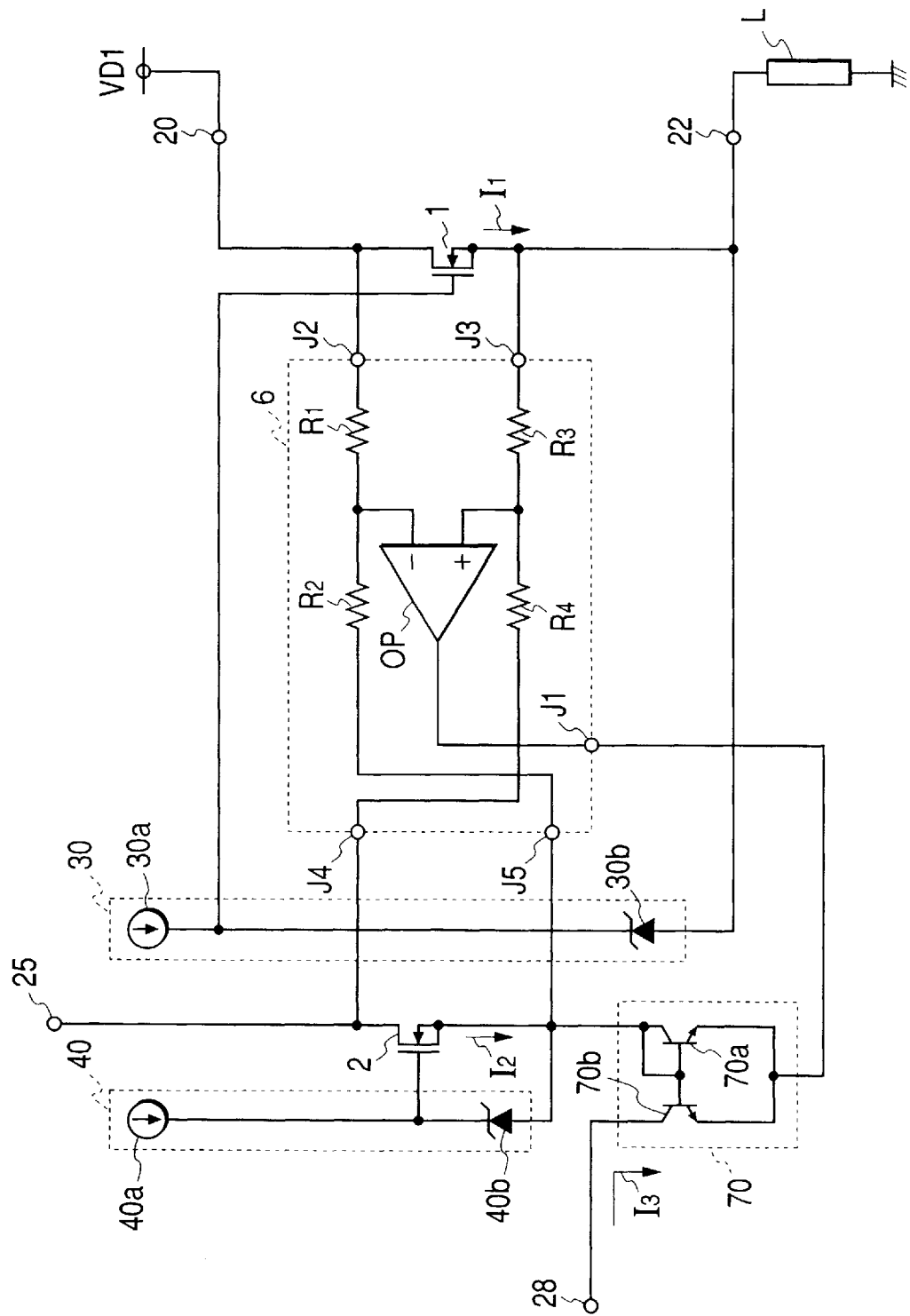
FIG. 8 is a circuit diagram which shows a current-measuring circuit according to the seventh embodiment of the invention.

FIG. 8 shows a current-measuring circuit according to the seventh embodiment of the invention.

The current-measuring circuit of this embodiment includes a current mirror 70 consisting of first and second npn transistors 70a and 70b. The first transistor 70a is connected at a collector to a base thereof and the source of the current-measuring transistor 2.

The second transistor 70b is connected at a base and an emitter to the base and emitter of the first transistor 70a and at a collector to the current-detecting terminal 28. The first and second transistors 70a and 70b are connected at the emitters thereof to the output terminal of the operational amplifier OP.

The current-measuring transistor 2 is connected at the drain to a high-potential terminal 25 leading to a voltage source (e.g., the voltage source VD1) capable of providing a voltage output equal to a maximum output voltage of the operational amplifier OP.

The operational amplifier OP of the voltage control circuit 6 is connected at the non-inverting input (+) to the junction of the resistors R3 and R4 and at the inverting input (−) to the junction of the resistors R1 and R2. Other arrangements are identical with those of the sixth embodiment shown in FIG. 7, and explanation thereof in detail will be omitted here.

In operation, when the current-carrying transistor 1 and the current-measuring transistor 2 are turned on by the first and second drivers 30 and 40, it will cause the current $I_1$ to flow from the voltage source VD1 to ground through the electric load L.

The voltage control circuit 6 controls the emitter voltages of the first and second transistors 70a and 70b of the current mirror 70 so that the drain-source voltage of the current-measuring transistor 2 may agree with the drain-source voltage of the current-carrying transistor 1. This causes the current $I_2$ to flow through the current-measuring transistor 2 and the first transistor 70a of the current mirror 70 which is proportional to the current $I_1$ flowing through the current-carrying transistor 1 and the electric load L. The flow of the current $I_2$ through the first transistor 70a causes the current $I_3$ that is a given multiple of the current $I_2$ to flow into the second transistor 70b from the current-measuring terminal 28. The measurement of the current $I_1$ flowing through the drain and source of the current-carrying transistor 1 is, thus, achieved by monitoring the current $I_3$.

Figure 9:
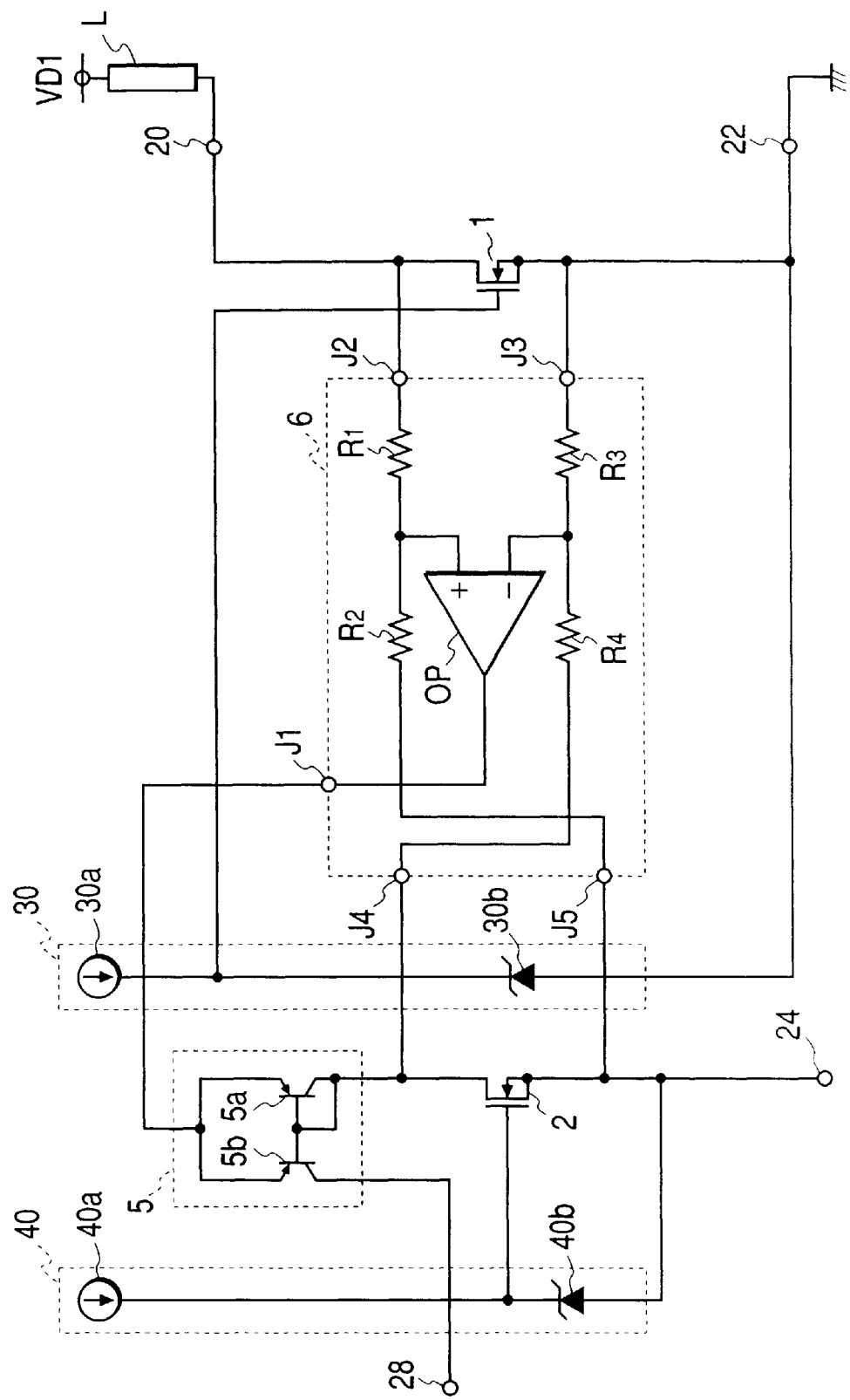
FIG. 9 is a circuit diagram which shows a current-measuring circuit according to the eighth embodiment of the invention.

FIG. 9 shows a current-measuring circuit according to the eighth embodiment of the invention which is different from the sixth embodiment shown in FIG. 7 in that the current-carrying transistor 1 is connected at the source to ground through the terminal 22 and at the drain to the voltage source VD1 through the electric load L and the terminal 20. Specifically, the current-measuring circuit of this embodiment has a low-side coupling structure in which the current-carrying transistor 1 is arranged at an electric potential lower than that of the electric load L. Other arrangements are identical with those of the sixth embodiment, and explanation thereof in detail will be omitted here.

Figure 10:
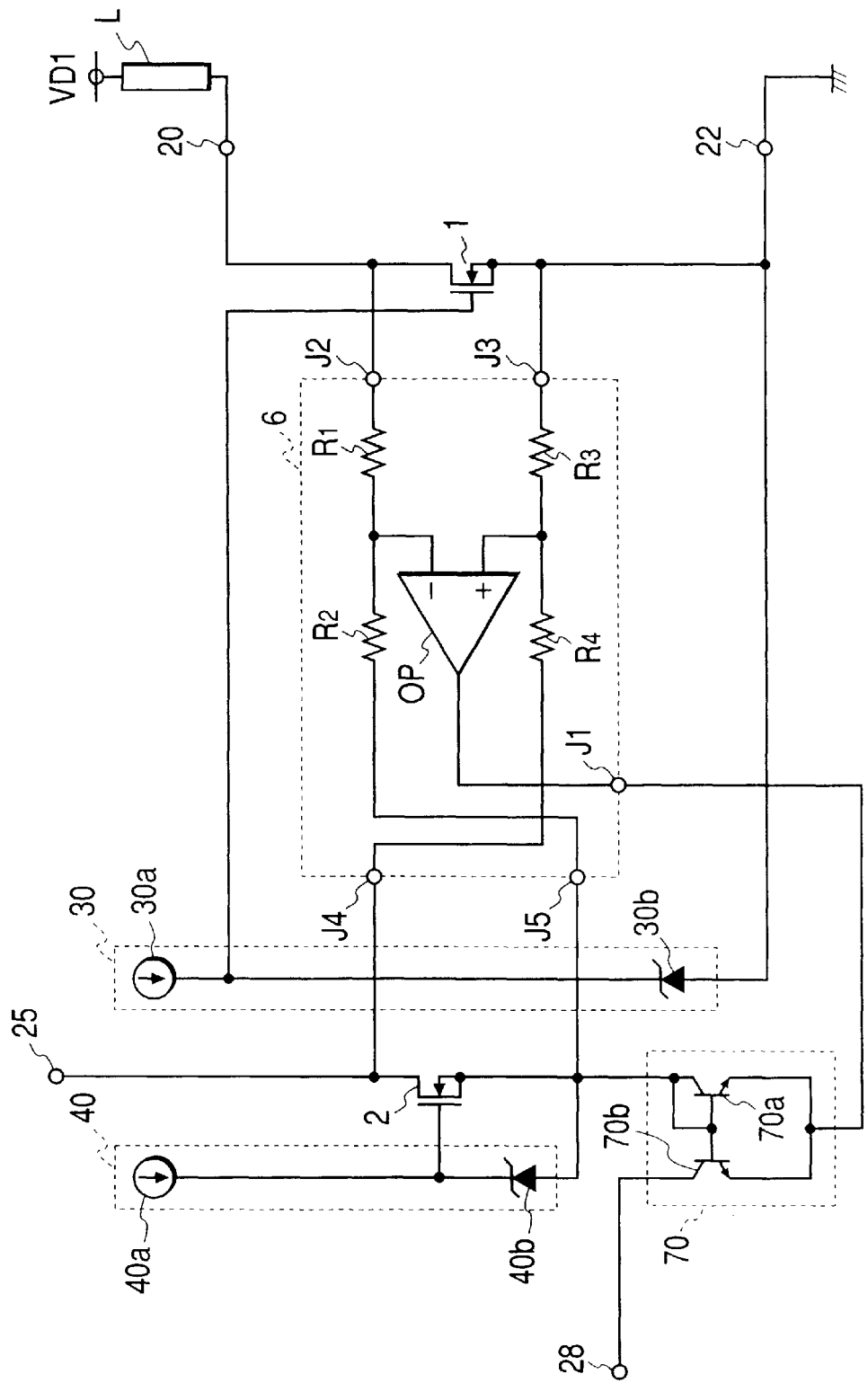
FIG. 10 is a circuit diagram which shows a current-measuring circuit according to the ninth embodiment of the invention.

FIG. 10 shows a current-measuring circuit according to the ninth embodiment of the invention which is different from the seventh embodiment shown in FIG. 8 in that the current-carrying transistor 1 is connected at the source to ground through the terminal 22 and at the drain to the voltage source VD1 through the electric load L and the terminal 20. Specifically, the current-measuring circuit of this embodiment has a low-side coupling structure in which the current-carrying transistor 1 is arranged at an electric potential lower than that of the electric load L. Other arrangements are identical with those of the seventh embodiment, and explanation thereof in detail will be omitted here.

The current-carrying transistor 1 and the current-measuring transistor 2 of the sixth to ninth embodiments may alternatively be implemented with a p-channel MOS transistor, a bipolar transistor, or a MIS (Metal-Insulator-Semiconductor) device.

For instance, in the case where npn transistors are used as the transistors 1 and 2, the npn transistor are connected at collectors, emitters, and bases thereof to portions of the circuit with which the drains, sources, and gates of the transistors 1 and 2 of the sixth to ninth embodiments connect. In this case, the excitation current flows from the constant current source 30a of the first driver 30 through the base and emitter of the current-carrying transistor 1. Similarly, the excitation current which is identical with that provided by the first driver 30 flows from the constant current source 40a of the second driver 40 through the base and the emitter of the current-measuring transistor 2.

The current mirrors 5 and 70 may alternatively consist of MOS transistors instead of the bipolar transistors or use any other similar circuit known in the art.

The first and second drivers 30 and 40 may alternatively be implemented with any other similar structure known in the art designed to match the gate-source voltages of the current-carrying transistor 1 and the current-measuring transistor 2 with each other.

Instead of the current mirrors 5 and 7, a resistor may be arranged in series between the output terminal of the operational amplifier OP and the current-measuring transistor 2. In this case, the measurement of the current $I_1$ may be accomplished by monitoring a potential difference appearing between both ends of the resistor to determine the current $I_2$ flowing through the current-measuring transistor 2.

While the voltage control circuit 6 controls the drain-source voltage of the current-measuring transistor 2 so as to agree with the drain-source voltage of the current-carrying transistor 1, the drain-source voltage ratio of the current-measuring transistor 2 to the current-carrying transistor 1 is not limited to one (1). For instance, both the resistance ratio (R2/R1) of the first resistor R1 to the second resistor R2 and the resistance ratio (R4/R3) of the third resistor R3 to the fourth resistor R4 may be two (2). In this case, the operational amplifier OP provides the output voltage so that the drain-source voltage of the current-measuring transistor 2 may be twice the drain-source voltage of the current-carrying transistor 1.

Figure 11:
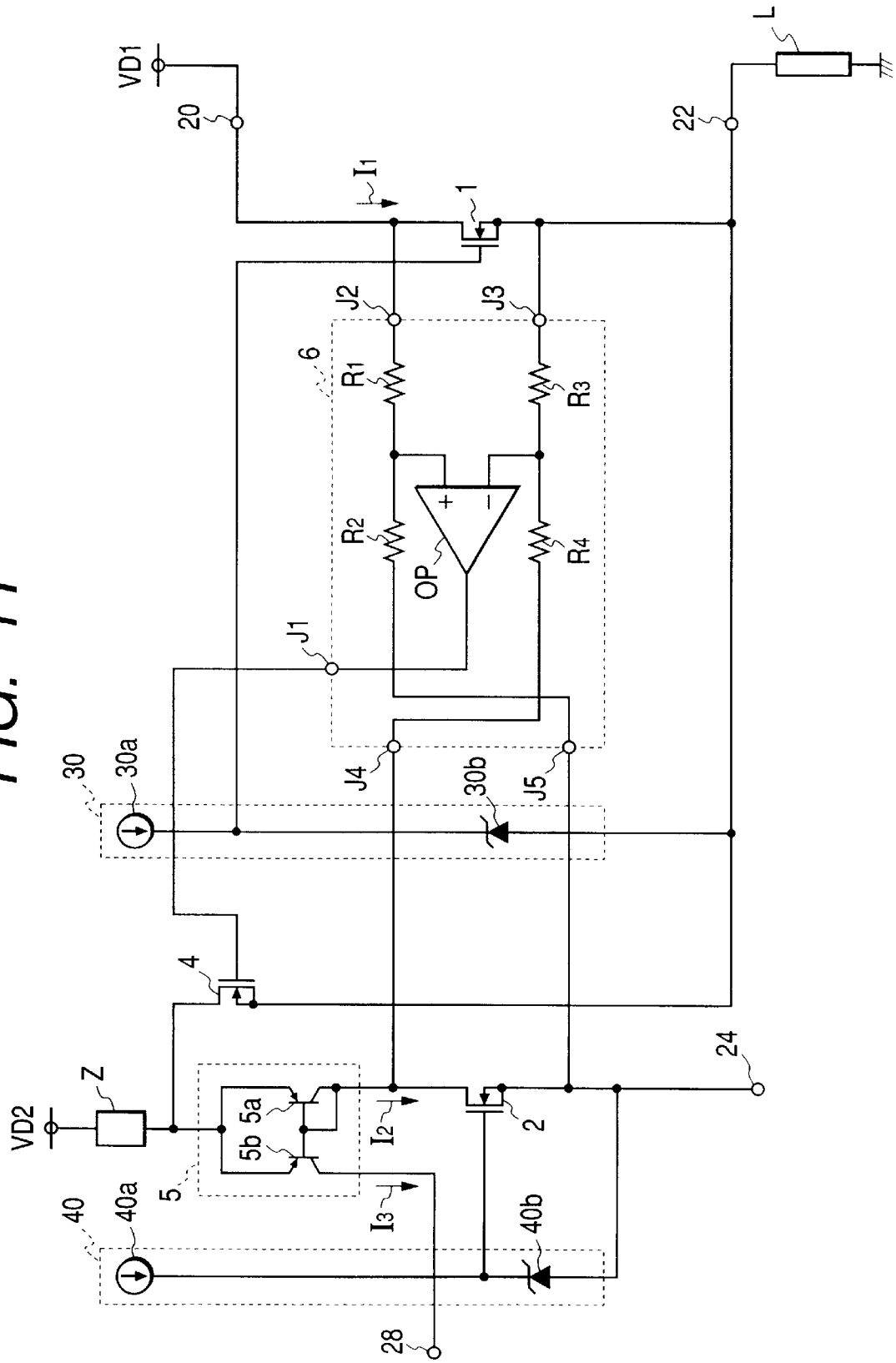
FIG. 11 is a circuit diagram which shows a current-measuring circuit according to the tenth embodiment of the invention.

FIG. 11 shows a current-measuring circuit according to the tenth embodiment of the invention which is different from the sixth embodiment shown in FIG. 7 only in that the voltage source VD2, the resistor Z, and the voltage control transistor 4 identical with those of the first embodiment shown in FIG. 2 are provided. Other arrangements are identical, and explanation thereof in detail will be omitted here.

This embodiment, thus, has the two advantages, as described above, offered by the first and sixth embodiments.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A current-measuring circuit for measuring a current flowing through an electric load comprising:

a first electric path in which the electric load is disposed, said first electric path having a first and a second terminal, the first terminal being at a first electric potential, the second terminal being at a second electric potential different from the first electric potential;

a current-carrying transistor having first, second, and third electrodes, the first electrode connecting with the first terminal of said first electric path, the second electrode connecting with the second terminal of said first electric path through said electric load, the third electrode being applied with an excitation signal to allow a current to flow between the first and second terminals of said first electric path through said electric load;

a second electric path having a first and a second terminal, the first terminal connecting with the first terminal of said first electric path, the second terminal being at a third electric potential;

a third electric path having a first and a second terminal, the first terminal being at a fourth electric potential, the second terminal connecting with said second electric path;

a current-measuring transistor disposed in said second electric path between a junction of said second and third electric paths and the first terminal of said first electric path, said current-measuring transistor being identical in a type and polarity with said current-carrying transistor and having first, second, and third electrodes, the first electrode connecting with the first electrode of said current-carrying transistor, the third electrode connecting with the third electrode of said current-carrying transistor;

a current mirror including a first and a second transistor, the first transistor being disposed in said second electric path between the junction of said second and third electric paths and the second electrode of said current-measuring transistor, the second transistor being disposed in said third electric path between the junction of said second and third electric paths and the first terminal of said third electric path to allow a current to flow therethrough that is a given multiple of a current flowing through the first transistor; and a voltage control circuit designed to match a voltage appearing at the second electrode of said current-measuring transistor with a voltage appearing at the second electrode of said current-carrying transistor so that the current flowing through said current-measuring transistor may be proportional to the current flowing through said current-carrying transistor, said voltage control circuit including a voltage-changing load, an operational amplifier, and a voltage-controlling transistor, said voltage-changing load being disposed in said second electric path in series with the second terminal of said second electric path and the first transistor of said current mirror to change a voltage developed at a junction of the voltage-changing load and the first transistor according to a current flowing through the voltage-changing load, the operational amplifier being connected at an inverting input to the second electrode of said current-carrying transistor and at a non-inverting input to the second electrode of said current-measuring transistor, the voltage-controlling transistor being connected at a first electrode to the first electrode of said current-measuring transistor, at a second electrode to the junction of the voltage-changing load and the first transistor, and at a third electrode to an output terminal of the operational amplifier to modify the current flowing through the voltage-changing load in response to an excitation signal inputted from the operational amplifier to the third electrode so as to control the voltage developed at the junction of the voltage-changing load and the first transistor so that the voltage appearing at the second electrode of said current-measuring transistor may match the voltage appearing at the second electrode of said current-carrying transistor.

2. A current-measuring circuit as set forth in claim 1, wherein the second electric potential is higher than the first electric potential, and wherein the voltage-controlling transistor of said voltage control circuit is an n-channel MOS transistor.

3. A current-measuring circuit as set forth in claim 1, wherein the second electric potential is lower than the first electric potential, and wherein the voltage-controlling transistor of said voltage control circuit is a p-channel MOS transistor.

4. A current-measuring circuit as set forth in claim 1, wherein the voltage-controlling transistor is a bipolar transistor having a collector, an emitter, and a base as the first, second, and third electrodes of the voltage-controlling transistor.

5. A current-measuring circuit as set forth in claim 4, wherein the second electric potential is higher than the first electric potential, and wherein the bipolar transistor is an npn bipolar transistor.

6. A current-measuring circuit as set forth in claim 4, wherein the second electric potential is lower than the first electric potential, and wherein the bipolar transistor is an npn bipolar transistor.

7. A current-measuring circuit as set forth in claim 1, wherein the voltage-changing load of said voltage control circuit is a resistor having a preselected resistance value.

8. A current-measuring circuit as set forth in claim 1, wherein the voltage-changing load includes a transistor and a current-restricting device, the transistor being connected at a first electrode to the second terminal of said second electric path, at a second electrode to the first transistor of said current mirror, and a third electrode to the current-restricting device, the current-restricting device restricting a current flowing through the transistor below a preselected value.

9. A current-measuring circuit for measuring a current flowing through an electric load comprising:

a first electric path in which the electric load is disposed, said first electric path having a first and a second terminal, the first terminal being at a first electric potential, the second terminal being at a second electric potential different from the first electric potential;

a current-carrying transistor having first, second, and third electrodes, the first electrode connecting with the first terminal of said first electric path, the second electrode connecting with the second terminal of said first electric path through said electric load, the third electrode being applied with an excitation signal to allow a current to flow through said electric load between the first and second terminals of said first electric path;

a second electric path having a first and a second terminal, the first terminal connecting with the first terminal of said first electric path, the second terminal being at a third electric potential;

a current-measuring transistor disposed in said second electric path, said current-measuring transistor being identical in a type and polarity with said current-carrying transistor and having first, second, and third electrodes, the first electrode connecting with the first electrode of said current-carrying transistor, the third electrode connecting with the third electrode of said current-carrying transistor; and a voltage control circuit designed to match a potential difference between the first and second electrodes of said current-measuring transistor with a potential difference between the first and second electrodes of said current-carrying transistor so that a current flowing through said current-measuring transistor may be proportional to the current flowing through said current-carrying transistor, said voltage control circuit including an operational amplifier and a voltage-controlling transistor, the operational amplifier being connected at an inverting input to the second electrode of said current-carrying transistor and at a non-inverting input to the second electrode of said current-measuring transistor, the voltage-controlling transistor being connected at a first electrode to the first electrode of said current-measuring transistor, at a second electrode to the second electrode of said current-measuring transistor, and at a third electrode to an output terminal of the operational amplifier to control the voltage developed at the second electrode of said current-measuring transistor so that the potential difference between the first and second electrodes of said current-measuring transistor matches the potential difference between the first and second electrodes of said current-carrying transistor.

10. A current-measuring circuit as set forth in claim 9, wherein said voltage control circuit also includes a voltage-changing load disposed in said second electric path in series with the second terminal of said second electric path and said current-measuring transistor to change a voltage developed at the second electrode of said current-measuring transistor according to a current flowing through the voltage-changing load, and wherein the voltage-controlling transistor is responsive to the excitation signal from the operational amplifier to modify the current flowing through the voltage-changing load so as to control the voltage developed at the second electrode of said current-measuring transistor so that the potential difference between the first and second electrodes of said current-measuring transistor matches the potential difference between the first and second electrodes of said current-carrying transistor.

11. A current-measuring circuit for measuring a current flowing through an electric load comprising:

an electric path in which the electric load is disposed, said electric path having a first and a second terminal, the first terminal being at a first electric potential, the second terminal being at a second electric potential different from the first electric potential;

a current-carrying transistor having first, second, and third electrodes, the first electrode connecting with the first terminal of said first electric path, the second electrode connecting with the second terminal of said first electric path through said electric load, the third electrode being applied with an excitation signal to allow a first current to flow between the first and second terminals of said electric path through the electric load;

a current-measuring transistor having a first and a second electrode through which a second current flows that is proportional to the first current flowing through the electric load and that is used to measure the first current, the first electrode being at a third potential; and a voltage control circuit connecting with the first and second electrodes of said current-measuring transistor and the first and second electrodes of said current-carrying transistor, said voltage control circuit controlling an electric potential appearing at the second electrode of said current-measuring transistor so that a potential difference between the first and second electrodes of said current-measuring transistor may be a given multiple of that between the first and second electrodes of said current-carrying transistor.

12. A current-measuring circuit as set forth in claim 11, wherein said voltage control circuit includes a first and a second voltage divider and an operational amplifier, the first voltage divider providing a first voltage output that is a fraction of a potential difference between a higher one of electric potentials developed at the first and second electrodes of said current-carrying transistor and a lower one of electric potentials developed at the first and second electrodes of said current-measuring transistor, the second voltage divider providing a second voltage output that is a fraction of a potential difference between a lower one of electric potentials developed at the first and second electrodes of said current-carrying transistor and a higher one of electric potentials developed at the first and second electrodes of said current-measuring transistor, the operational amplifier changing the electric potential appearing at the second electrode of said current-measuring transistor so as to match the first voltage output with the second voltage output.

13. A current-measuring circuit as set forth in claim 11, wherein said current-carrying transistor and said current-measuring transistor are each implemented with a MOS transistor.

14. A current-measuring circuit as set forth in claim 13, further comprising a first and a second driver, said first driver applying an excitation voltage across a gate and a source of said current-carrying transistor to allow the first current to flow through said current-carrying transistor, the second driver applying an excitation voltage across a gate and a source of said current-measuring transistor to allow the second current to flow through said current-measuring transistor.

15. A current-measuring circuit as set forth in claim 11, wherein said current-carrying transistor and said current-measuring transistor are each implemented with a bipolar transistor.

16. A current-measuring circuit as set forth in claim 15, further comprising a first and a second driver, said first driver applying an excitation voltage across a base and an emitter of said current-carrying transistor to allow the first current to flow through said current-carrying transistor, the second driver applying an excitation voltage across a base and an emitter of said current-measuring transistor to allow the second current to flow through said current-measuring transistor.

17. A current-measuring circuit as set forth in claim 11, further comprising a current mirror which includes a first and a second transistor, the first transistor being disposed between said voltage control circuit and said current-measuring transistor so that the second current flows through the first transistor, the second transistor being disposed between said voltage control circuit and an output terminal so that a third current flows through the second transistor that is a given multiple of the second current.

18. A current-measuring circuit as set forth in claim 12, further comprising a voltage-changing load and a voltage-controlling transistor, said voltage-changing load having a first end connected to a voltage source and a second end connected to the second electrode of said current-measuring transistor to change a voltage developed at the second end thereof according to a current flowing through the voltage-changing load from the voltage source, the voltage-controlling transistor being disposed in parallel to said current-measuring transistor and connected at a first electrode to the first electrode of said current-measuring transistor, at a second electrode to a junction of the second end of said voltage-controlling load and the second electrode of said current-measuring transistor, and at third electrode to the output terminal of the operational amplifier to modify the current flowing through the voltage-changing load in response to the excitation signal inputted from the operational amplifier so as to control the voltage developed at the second end of the voltage-changing load so that the voltage appearing at the second electrode of said current-measuring transistor may match the voltage appearing at the second electrode of said current-carrying transistor.

* * * * *